United States Patent [19]

Saitou

[11] Patent Number: 4,996,432
[45] Date of Patent: Feb. 26, 1991

[54] RADIATION DETECTOR

[75] Inventor: Satoshi Saitou, Tochigi, Japan

[73] Assignee: Kabushiki Kaisha Toshiba, Kawasaki, Japan

[21] Appl. No.: 102,489

[22] Filed: Sep. 29, 1987

[30] Foreign Application Priority Data

Sep. 30, 1986 [JP] Japan .................. 61-233470

[51] Int. Cl.⁵ .............................................. G01T 1/24
[52] U.S. Cl. ......................... 250/370.01; 250/370.09
[58] Field of Search ................ 250/370.01, 370.08, 250/370.09, 211 R, 370.12, 370.13, 370.06; 357/84

[56] References Cited

U.S. PATENT DOCUMENTS

| | | | |
|---|---|---|---|
| 3,548,213 | 12/1970 | Owen et al. | 250/211 R |
| 3,665,193 | 5/1972 | Kozlov et al. | 250/370.01 |
| 4,255,659 | 3/1981 | Kaufman et al. | 250/370.09 |

OTHER PUBLICATIONS

Bell et al., "Cadmium Telluride, Grown From Tellurium Solution, as a Material for Nuclear Radiation Detectors", Phys. Stal. Sol. (a)1(3), pp. 375-387, 1970.
Snow, "Self-Scanning Photodiode Arrays for Spectroscopy", Research Development, Apr. 1976, pp. 18–22.
IEEE Trans. On Nuclear Science. vol. NS-23 (1976), pp. 131 to 137, Swierkowski, "A Comprehensive Model for Predicting Semiconductor Performance".
Nuclear Instruments and Methods, vol. 162 (1979) pp. 113 to 123, Whited et al., "Cadmium telluride and Mercuric Iodide Gamma Radiation Detectors".

Primary Examiner—Carolyn E. Fields
Attorney, Agent, or Firm—Finnegan, Henderson, Farabow, Garrett, and Dunner

[57] ABSTRACT

A radiation detector providing high energy resolving power, wherein a semiconductor crystal block having a thickness D has two mutually opposed surfaces and is designed to convert incident photons into electron-hole pairs. An electrode connected to a ground is fixed to one of these surfaces and receives the incident photons and another electrode connected to a positive high voltage is fixed to the other surface of the semiconductor crystal block so that the mean free path of electrons of the pairs is substantially larger than thickness D and the mean free path of holes of the pairs is substantially smaller than thickness D, and the positions of the conversion of photons to electron-hole pairs with respect to the electrode connected to a positive high voltage is substantially constant. Thickness D is determined by the relationship of $D >> 1/\mu_i$ wherein $\mu_i$ is absorption coefficient of the semiconductor block so that the converted electrical changes are generated near the electrode connected to a ground.

8 Claims, 5 Drawing Sheets

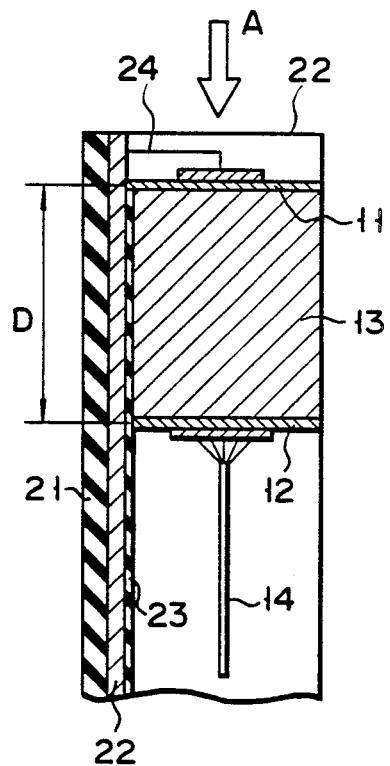
F I G. 3(A)
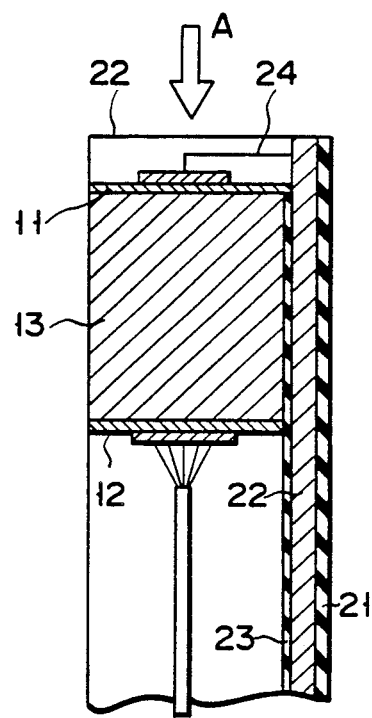
F I G. 3(B)
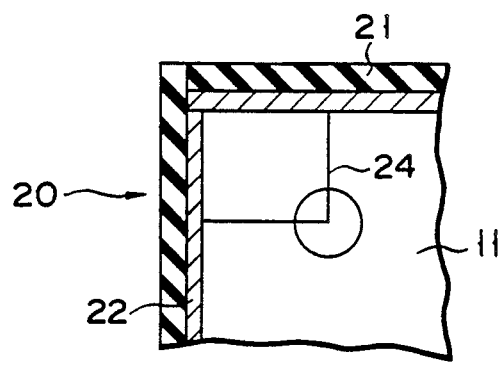
F I G. 3(C)

RADIATION DETECTOR

BACKGROUND OF THE INVENTION

The present invention relates to a radiation detector and, more particularly, to a direct-conversion type semiconductor radiation detector for measuring the photo energy of a radiation.

A detector, such as a spectrometer counter utilizing the external photoelectric effect of a photocell, has been known as a device for detecting a radiation such as a gamma-ray.

Recently, a direct-conversion type semiconductor radiation detector for transforming a photon energy directly into an electric signal has been developed by utilizing the internal photoelectric effect induced by the interaction between a semiconductor and a radiation.

FIG. 1 shows a bulk type semiconductor detector. In FIG. 1, two electrodes are so disposed on the side surfaces of the bulk type semiconductor detector as to face each other and extend along the photon-incident direction. A voltage is applied between both electrodes 5 and 6 of the semiconductor detector. When photons are applied to a semiconductor detector, pairs of electrons and positive holes 3 and 4 are generated in a semiconductor crystal by an internal photoelectric effect resulting from the energy of the photons incident on the detector. The energy of the photons is substantially proportional to the energy of the electron-positive hole pairs. When the electron-positive hole pairs are generated in the semiconductor crystal, electrons 3 move toward electrode 5 of positive voltage side, positive holes 4 move toward electrode 6 of earth side so that the electrons and the positive holes arrive at the electrode surfaces. Upon movements of the electrons and the positive holes, a signal current corresponding to the energy of the photons is generated in an external circuit connected between both the electrodes. This signal current is detected as an integration of a voltage signal by the external circuit. Thus signal charge arrived at the electrode surfaces has a correlation with the intensity of the radiation. Signal charge Qout arrived at both the electrodes is represented by the following equation (1):

$$Q_{out} = Q_e \lambda_e / D (1 - e^{-X/\lambda_e}) + Q_h \lambda_h / D (1 - e^{(D-X)/\lambda_h}) \quad (1)$$

where $Q_e$, $Q_h$: charge quantities of electrons and positive holes ($Q_e = Q_h$)
$\lambda_e$, $\lambda_h$: mean free paths of electrons and positive holes
D: distance between electrodes
X: distance between the positive voltage electrode and to the position where pairs of electrons-positive holes are generated.

Equation (1) is a general equation, in which the first term is charge quantity by the electrons, and the second term is charge quantity by positive holes. In actual measurements, carriers are captured in a defect, such as lattice defect, formed in a semiconductor detector of a room temperature operable type, having high quantum efficiency made of CdTe, $HgI_2$ or GaAs. Since the probability of capturing positive holes is particularly high, most cases satisfy $\lambda_h < < D$. Thus, the energy of the photons is determined by only the quantity of generated electrons, because the charge by positive holes can be substantially ignored.

In such a case, the signal charge Qout is approximately represented by the following equation (2).

$$Q_{out} = Q_e \lambda_e / D (1 - e^{-X/\lambda_e}) \quad (2)$$

In equation (2), it is understood that signal charge depends upon distance (X) between the position where the pairs of electrons and positive holes are generated, and the electrode of positive voltage side. Thus, charge Q varies according to the generated position. In other words, in conventional bulk type semiconductor detector, charge might be influenced by the distance (X), and signal voltage might also be varied.

Conventional bulk type semiconductor detector has energy-spectral characteristic of the photons as shown in FIG. 2.

FIG. 2 shows the relationship between the number of output signal counted by a radiation detector and the energy of its signal when photons having a predetermined intensity are continuously applied to a conventional semiconductor detector. In FIG. 2, an ordinate axis indicates the number of photons counted during a predetermined time, which represents the specific output value, and an abscissa axis indicates the value of an output signal corresponding to the energy of photons. It is understood from the spectral characteristic in FIG. 2 that a detection signal varies in the conventional detector. It is desired that a sharp peak should be presented only at the specific value corresponding to the energy of incident photons. In fact, as shown in FIG. 2, since the position of generating the electrons affects the output signal, a number of irregularities are observed, which cause energy resolving power to be remarkably reduced.

SUMMARY OF THE INVENTION

An object of the present invention is to provide a radiation detector for measuring the energy of a radiation, which can enhance an energy resolving power.

A radiation detector of the present invention comprises an earth side electrode disposed perpendicularly to the photon incident direction, a positive voltage electrode disposed at a distance D backward from the earth side electrode and having a positive voltage with respect to the earth electrode, and a semiconductor interposed between the earth electrode and the positive voltage electrode, wherein the distance D between both the electrodes satisfies $D >> 1/\mu_i$ ($\mu_i$ is the absorption coefficient of the detector). If the absorption coefficient and the thickness of the radiation detector are great enough to capture the photons applied through the earth electrode into a semiconductor crystal, the pairs of electrons and positive holes are generated near the surface of the radiation detector, i.e., near the earth electrode plate in the radiation detector.

The radiation detector having characteristics of $\lambda_e >> D$, $\lambda_h << D$ detects radiation, based on the charge of electrons arrived at the electrode. The signal charge Qe of the arrived electrons is given by equation (2). In equation (2), $\lambda_e$ is the mean free path of the electron, which is generally represented by the following equation.

$$\lambda_e = \mu_e . \tau_e . E_i$$

where $\mu_e$: mobility of electron
$\tau_e$: lifetime of electron
$E_i$: energy of the incident radiation
This can be measured in advance, and is handled as a specific value.

Mean distance X between the position of generating pairs of electrons and positive holes, and the positive voltage electrode is represented by the following equation (3):

$$X = D - 1/\mu_i \tag{3}$$

$\mu_i$: absorption coefficient of semiconductor detector correspond to Ei.

The term, $1/\mu_i$ in equation (3), indicates mean distance between the position where electrons are generated in the detector, and the earth side electrode. When mean distance $1/\mu_i$ satisfies the condition of $D \gg 1/\mu_i$, the pairs of electrons-positive holes become approx. $X = D$, i.e., the pairs of electrons-positive holes are generated near the surface of the semiconductor crystal directly under the earth side electrode of the radiation incident side.

As described above, signal charge Qout in equation (2) depends only upon charge Qe of generated electrons, but does not depend upon λe and X. Thus, the detector of the present invention can reduce the irregularities of position of generating the pairs of electrons and positive holes, as compared with the conventional detector in which the arranging direction of both the electrodes is parallel to the incident direction of radiation, thereby providing a radiation detector having high energy resolving power.

Since the electrons are generated near the earth side electrode and moved to the positive voltage side electrode, the moving distance of the electron is approx. D. Thus, a radiation detector is provided in which the ratio of the irregularity of the generating position to the moving distance of the electron decreases, i.e., S/N ratio increases, and which therefore has high energy resolving power.

BRIEF DESCRIPTION OF THE DRAWINGS

FIGS. 3(A), 3(B) and 3(C) are front view, side view and plan view schematically showing an embodiment of radiation detector;

DETAILED DESCRIPTION OF THE PREFERRED EMBODIMENTS

Figure 4:
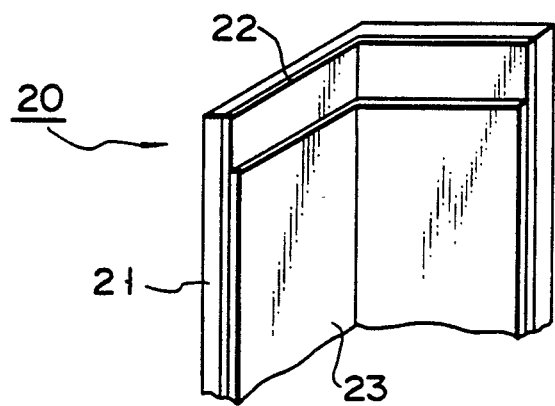
FIG. 4 is a schematic perspective view showing the frame of a 3-layer substrate structure shown in FIGS. 3(A) to 3(C)

FIGS. 3(A), 3(B) and 3(C) show an embodiment of a radiation detector according to the present invention. FIG. 4 shows a frame having an electric field shielding material and a 3-layer substrate structure. A frame has also a function as a lead from an earth electrode.

Earth side electrode 11 is so disposed as to be exposed to photons in a radiation detector in FIG. 3. Earth side electrode 11 is fixed on a photon incident surface of the semiconductor crystal block 13 for converting photons to electrical charges. Positive electrode 12 is fixed to the other surface of semiconductor crystal block 13 opposing the photon incident surface, and is arranged apart from the earth electrode 11 at a predetermined distance D which is equal to a thickness of semiconductor crystal block 13 and satisfies $D \gg 1/\mu_i$. Lead 14 of positive high voltage side is connected to positive electrode 12. Earth electrode 11 is connected by lead 24 to metal layer 22 of frame 20 having a 3-layer substrate structure.

The inside faces of frame 20 are contacted with two adjacent surfaces of the semiconductor crystal block, respectively. In FIG. 4, in frame 20, metal layer 22 is bonded to the insides of L-shaped insulating substrate 21, and insulating film 23 is formed on the metal layer 22 except the upper end portions of layer 22.

The operation of the radiation detector, constructed as described, will be described.

Figure 1:
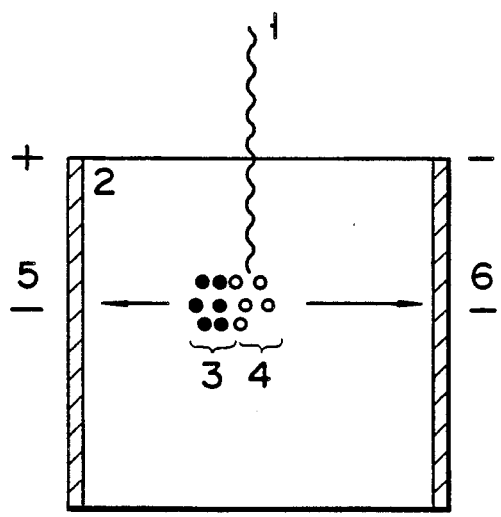
FIG. 1 is a schematic view of a conventional radiation detector.
Figure 5:
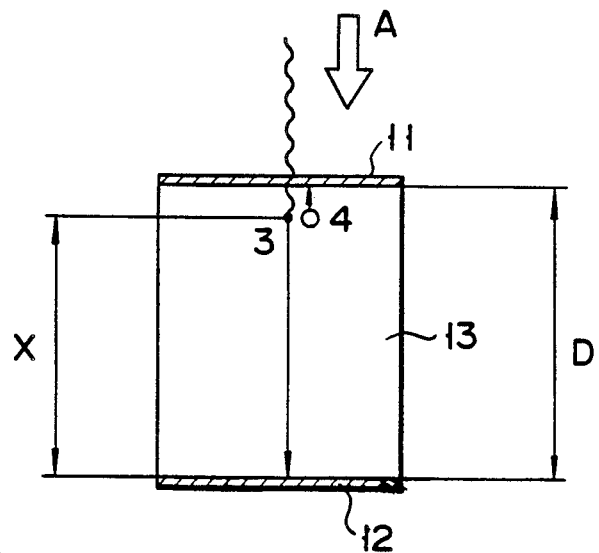
FIG. 5 is a sectional view schematically showing the radiation detector shown in FIGS. 3(A) to 3(C)

FIG. 5 schematically shows the relative positional relationship between a region wherein pairs of electrons and positive holes 3 and 4 are produced, and the positions of earth electrode 11 and positive electrode 12. The photons incident on earth plate 11 along direction A pass through earth electrode plate to semiconductor crystal 13. The incident photons are converted into pairs of electrons-positive holes by the internal photo electric effect in the semiconductor crystal. Most pairs of electrons-positive holes are produced in a region near the earth side electrode plate in the semiconductor crystal. In other words, pairs of electrons-positive holes 3 and 4 are generated on the surface region of semiconductor crystal block 13. Since distance X between positive electrode 12 and the surface region is substantially constant, the irregularity of generating the pairs of electrons and positive holes 3 and 4 can be sufficiently smaller than that of the conventional detector in FIG. 1.

Figure 2:
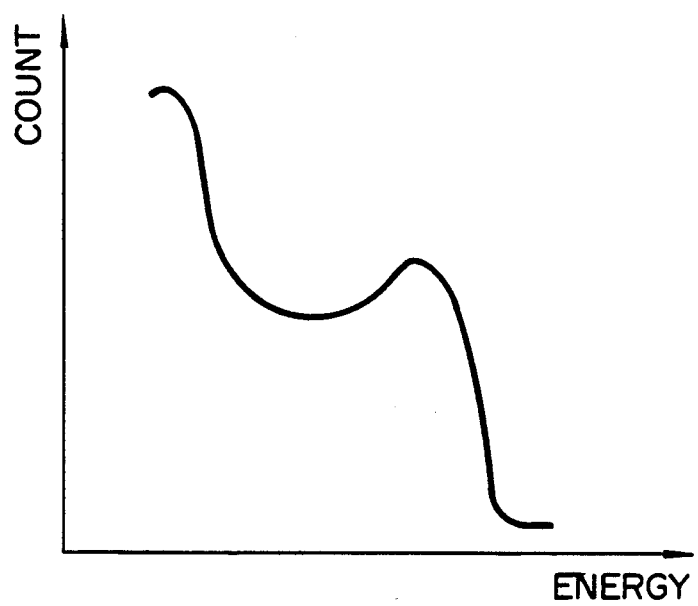
FIG. 2 is a graphic diagram showing energy-spectral characteristic by the conventional radiation detector.
Figure 6:
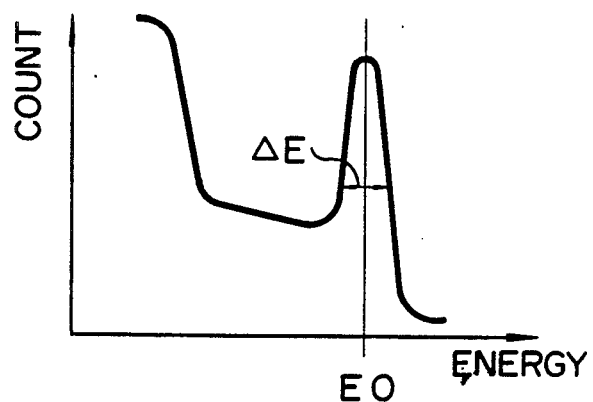
FIG. 6 is a graphic diagram showing the energy-spectral characteristic of a radiation detector according to the present invention.

FIG. 6 indicates output signal characteristic of the radiation detector according to the embodiment of the present invention. As apparent from the comparison of this characteristic with that of the conventional detector in FIG. 2, the detector of the present invention has a sharp energy peak at the specific value, and thus has high energy resolving power (i.e., $\Delta E/E_0$).

Electrons 3 generated near the earth electrode are moved by distance D between the electrodes and captured by positive electrode 13. Thus, a radiation detector is provided in which the ratio of the irregularity of the generating position to the moving distance of the electrons, i.e., S/N ratio increases.

Figure 7:
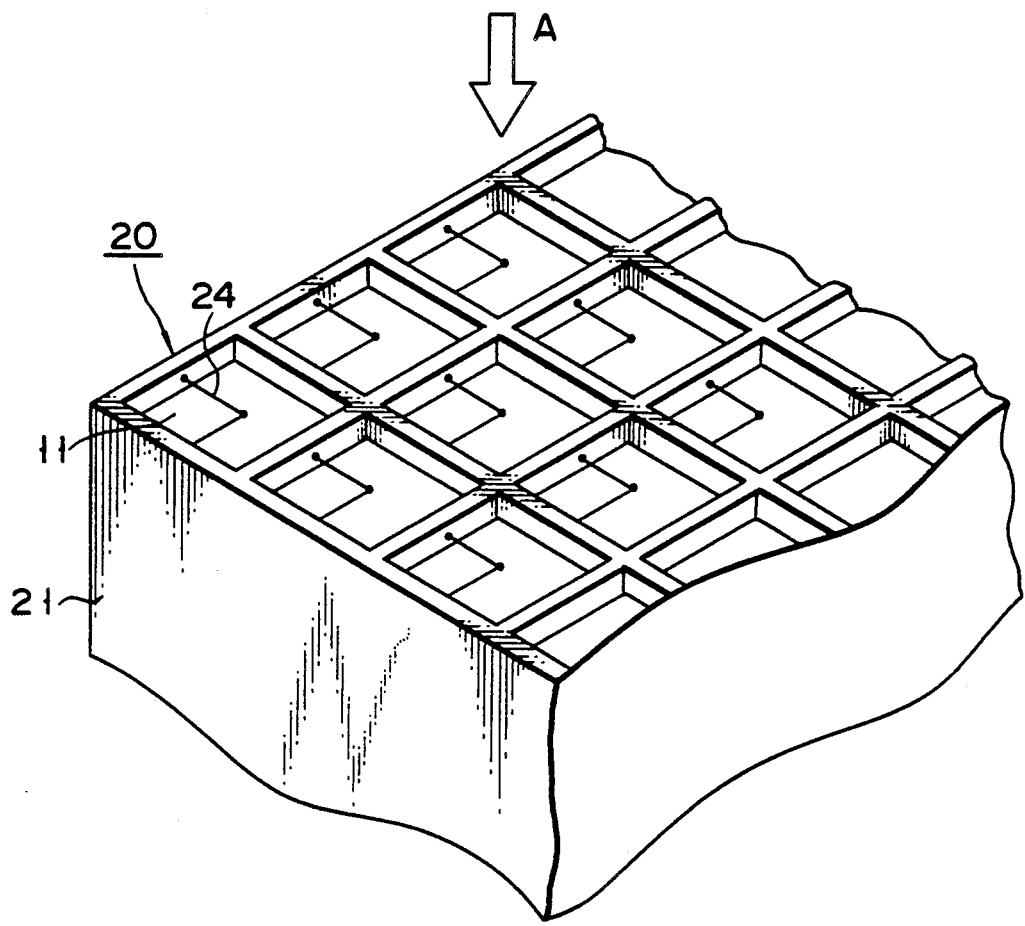
FIG. 7 is a schematic perspective view of a gamma-camera in which detectors shown in FIGS. 3(A) to 3(C) are arranged in a matrix array.
Figure 8:
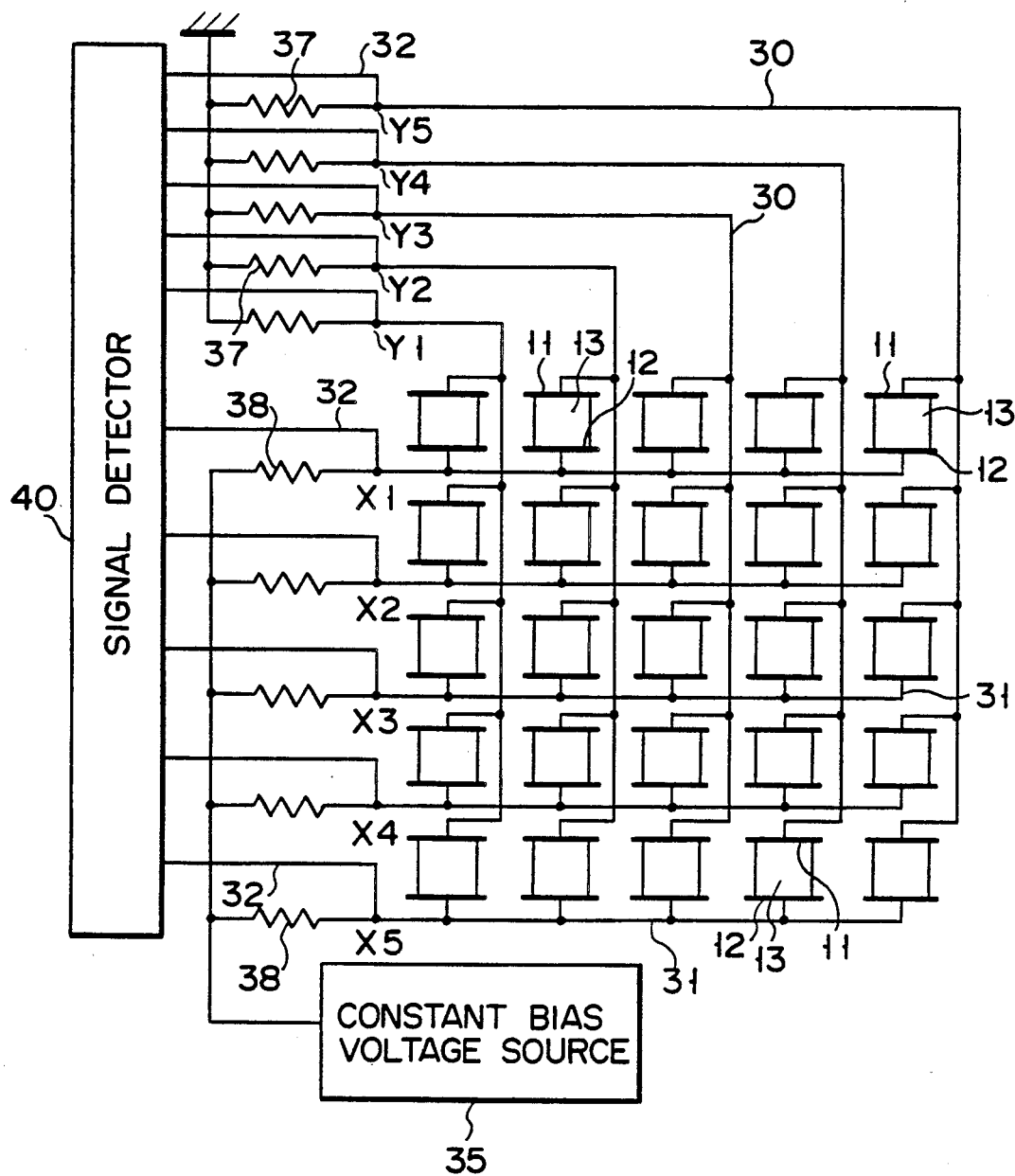
FIG. 8 is an electric circuit diagram of the gamma-camera shown in FIG. 7.

FIG. 7 shows a gamma-camera system for measuring photon distribution in which a number of radiation detectors are arranged in matrix array to be electrically connected with each other. In the system in FIG. 7, the individual radiation detectors have the frames of the above-mentioned 3-layer substrate structure. The frames are integrated with the frames of the other radiation detectors of same row or column adjacent to the frame, and associated in a matrix array structure. The individual detectors are connected as already disclosed by Jerry D. Allison in *Cadmium Telluride Matrix Gamma Camera*, Am. Assoc. Phys. Med, Vol. 7, No. 3, May/June, 1980, P203. As shown in FIG. 8, the detectors are connected, thereby forming a matrix array of X rows and Y columns. For example, earth electrodes 11 are electrically connected by common earth lead 30 in each row, and the ends of earth leads 30 are grounded. Positive electrodes 12 are electrically connected by common high voltage lead 30 in each column, and the ends of positive high voltage lead 31 are connected to constant bias voltage source 35. Voltage source 35 applies a voltage between the earth electrodes and the positive high voltage electrodes. The earth electrode and the positive high voltage electrode, to which the voltage is applied, are connected by leads 32 to signal detectors 40, respectively. Thus, when photons are incident to one detector, electrical charges flow between the electrode plates of the detectors. In this case, the current signals generated in common leads 30 and 31 connected in every row and column are converted by corresponding resistors 37 and 38 to voltage signals. The voltage signals are applied through leads 32 to signal detector 40. Signal detector 40 processes the signals to measure the intensity and distribution of the radiation incident on the detector.

In the embodiment described above, metal layers 22 connected to each other are used as earth side leads 30. Thus, in matrix array radiation detectors, signals are produced and output from earth side electrodes 11 with a high efficiency. In this manner, the detector can be reduced in size.

Semiconductor crystal 13 is provided in the frame of 3-layer substrate structure, and is substantially enclosed by metal layer 22 of the frame 24 and the electrodes 11, 12. Thus, the semiconductor crystal is shielded against an external electric field. As a result, the noise generated in the detector is effectively decreased by metal layer 22.

The present invention is not limited to the particular embodiments. Various other changes and modifications can be made within the spirit and scope of the present invention.

According to the present invention as described, above, the detector is so disposed that the incident photons are applied through the earth electrode to the semiconductor crystal, and distance D between the electrodes is set to satisfy $D \gg 1/\mu_i$. Thus, a radiation detector having high resolving power can be provided.

What is claimed is:

1. A radiation detector comprising:
a semiconductor block made of semiconductor crystal material for converting incident photons into electrical charges, which has a first surface and a second surface, the second surface disposed opposite the first surface;
a first electrode fixed to the first surface, said first electrode being at least partially transparent to incident photons and means for connection to a ground for allowing the photons to pass therethrough into the semiconductor block; and
a second electrode fixed to the second surface, said second electrode including means for connection to a positive high voltage, and wherein
a distance D between said first and second electrodes is determined by $D \gg 1/\mu_i$
where $\mu_i$ is absorption coefficient of the detector.

2. A radiation detecting apparatus comprising:
a plurality of radiation detectors disposed adjacent to each other in a matrix array, each of said radiation detectors comprising:
a semiconductor block made of a semiconductor crystal material for converting incident photons into electrical charge, which has a first surface and a second surface, the second surface disposed opposite the first surface;
a first electrode fixed to the first surface, said second electrode being at least partially transparent to incident photons and means for connection to a ground for allowing the photons to pass therethrough into the semiconductor block; and
a second electrode fixed to the second surface, said second electrode including means for connection to a positive high voltage, and wherein
a distance D between said first and second electrode is determined by $D \gg 1/\mu_i$
wherein $\mu_i$ is absorption coefficient of the detector.

3. A radiation detecting apparatus comprising:
a plurality of radiation detectors disposed adjacent to each other in a matrix array, each of said radiation detectors comprising:
a semiconductor block having four side faces made of semiconductor crystal material for converting incident photons into electrical charge, which has a first surface and a second surface, the second surface disposed opposite the first surface;
a first electrode fixed to the first surface, said first electrode including means for receiving incident photons and means for connection to a ground for allowing the photons to pas therethrough into the semiconductor block; and
a second electrode fixed to the second surface, said second electrode including means for connection to a positive high voltage,
the four side faces of said semiconductor block being enclosed by an electric field shielding material,
wherein said means for connection to a ground includes a metal layer disposed adjacent at least one of the four side surfaces of the semiconductor block, said metal layer of the semiconductor block being connected to the metal layer of at least one adjacent semiconductor block in a row or column.

4. The radiation detecting apparatus according to claim 3, wherein the electric field shielding material for enclosing the semiconductor block is used also as an electric field shielding material of other adjacent detectors.

5. The radiation detecting apparatus according to claim 3, wherein the electric field shielding material is composed of an insulating substrate, a metal layer formed on one side surface of the insulating substrate, and an insulating layer for insulating the metal layer from the crystal.

6. The radiation detecting apparatus according to claim 3, wherein positive high voltage side electrode plates are electrically connected in every row (or column) in the matrix array detectors.

7. A radiation detector comprising:
a semiconductor block made of a semiconductor crystal material for converting incident photons into electrical charges, which has a first surface and a second surface, the second surface disposed opposite the first surface;
a first electrode fixed to the first surface, said first electrode being at least partially transparent to incident photons and means for connection to a ground for allowing the photons to pass therethrough into the semiconductor block; and
a second electrode fixed to the second surface, said second electrode including means for connection to a positive high voltage such that the mean free paths of electrons $\lambda_e$ and positive holes $\lambda_h$ produced in said semiconductor block is determined by $\lambda_e \gg D$ and $\lambda_h \ll D$, and wherein a distance D between said first and second electrode is determined by $D \gg 1/\mu_i$
where $\mu_i$ is absorption coefficient of the detector.

8. A radiation detecting apparatus comprising:

a plurality of radiation detectors disposed adjacent to each other in a matrix array, each of said radiation detectors comprising:

a semiconductor block made of a semiconductor crystal material for converting incident photons into electrical charge, which has a first surface and a second surface, the second surface disposed opposite the first surface;

a first electrode fixed to the first surface, said second electrode including means for receiving incident photons and means for connection to a ground for allowing the photons to pass therethrough into the semiconductor block; and a second electrode fixed to the second surface, said second electrode including means for connection to a positive high voltage such that the mean free paths of electrons $\lambda_e$ and positive holes $\lambda_h$ produced in said semiconductor block is determined by $\lambda_e \gg D$ and $\lambda_h \ll D$, and wherein a distance D between said first and second electrode is determined by $D \gg 1/\mu_i$ where $\mu_i$ is absorption coefficient of the detector.

* * * * *

UNITED STATES PATENT AND TRADEMARK OFFICE
CERTIFICATE OF CORRECTION

PATENT NO. : 4,996,432
DATED : February 26, 1991
INVENTOR(S) : Satoshi Saitou

It is certified that error appears in the above-identified patent and that said Letters Patent is hereby corrected as shown below:

Claim 3, column 6, line 24, change "pas" to --pass--.

Signed and Sealed this

Sixth Day of April, 1993

Attest:

STEPHEN G. KUNIN

*Attesting Officer*  *Acting Commissioner of Patents and Trademarks*